United States Patent
Zakel et al.

[11] Patent Number: 6,012,625
[45] Date of Patent: Jan. 11, 2000

[54] PROCESS AND DEVICE FOR FORMING RAISED METALLISED CONTACTS

[75] Inventors: Elke Zakel, Falkensee; Jens Nave, Berlin, both of Germany; Joachim Eldring, Phoenix, Ariz.

[73] Assignee: Fraunhofer-Gesellschaft zur Forderungder angewandten Forschung e.V., Munich, Germany

[21] Appl. No.: 08/913,697

[22] PCT Filed: Mar. 11, 1996

[86] PCT No.: PCT/DE96/00425

§ 371 Date: Nov. 12, 1997

§ 102(e) Date: Nov. 12, 1997

[87] PCT Pub. No.: WO96/28275

PCT Pub. Date: Sep. 19, 1996

[30] Foreign Application Priority Data

Mar. 10, 1995 [DE] Germany ............... 195 08 677

[51] Int. Cl.⁷ .............. B23K 1/00; B23K 31/02
[52] U.S. Cl. .......... 228/254; 228/180.5; 228/4.5; 29/843
[58] Field of Search ............... 228/180.5, 254, 228/4.5; 29/843, 879

[56] References Cited

U.S. PATENT DOCUMENTS

| | | | |
|---|---|---|---|
| 4,415,115 | 11/1983 | James | 228/170 |
| 4,645,118 | 2/1987 | Biggs et al. | 228/170 |
| 5,090,119 | 2/1992 | Tsuda et al. | 29/843 |
| 5,172,851 | 12/1992 | Matsushita et al. | 228/4.5 |
| 5,299,729 | 4/1994 | Matsushita et al. | 228/180.22 |
| 5,485,949 | 1/1996 | Tomura et al. | 228/4.5 |
| 5,550,083 | 8/1996 | Koide et al. | 228/180.5 |
| 5,740,956 | 4/1998 | Seo et al. | 228/254 |

FOREIGN PATENT DOCUMENTS

| | | |
|---|---|---|
| 0 320 244 | 6/1989 | European Pat. Off. . |
| 0 393 832 | 10/1990 | European Pat. Off. . |
| 0 632 484 | 1/1995 | European Pat. Off. . |
| 2 534 834 | 4/1984 | France . |
| 32 09 242 | 11/1982 | Germany . |
| 4-159743 | 6/1992 | Japan ................. 228/180.5 |

OTHER PUBLICATIONS

Patent Abstracts of Japan; vol. 17, No. 640 (E–1465); A 5206223.
Search Report of PCT corresponding application (PCT/DE 96/00425).

*Primary Examiner*—Patrick Ryan
*Assistant Examiner*—Jeffrey T. Knapp
*Attorney, Agent, or Firm*—Darby & Darby

[57] ABSTRACT

Process and device is available for forming a raised contact metallization (18) on a connection surface (11) of a substrate (10) with the use of a wire bonding device with a bonding tool (26). First of all, a wire end section of a contact material wire (13), drawn from a nose-piece (27), is connected to the connection surface (11) with the application of pressure and temperature, and subsequently a separation of the wire end section (29), connected to the connection surface (11), from the remaining contact material wire (13) takes place. The process further includes these steps:

making a first connection between a free end of the wire end section (29) and the connection surface (11) for the formation of a first connection region (21), making a second connection between a running end of the wire end section (29) and the connection surface (11) or a partial region of the wire end section (29) in such a way that between the first connection region (21) and the second connection region (22) a defined length of wire (19) is formed, and the connection regions (21, 22) form together with the length of wire (19) a contact material volume (25), remelting of the contact material volume (25) formed on the connection surface (11) for the formation of the raised contact metallization (18).

5 Claims, 3 Drawing Sheets

PROCESS AND DEVICE FOR FORMING RAISED METALLISED CONTACTS

FIELD OF THE INVENTION

The present invention relates to a process and a device in accordance with the preamble of claims 1 and 4.

BACKGROUND OF THE INVENTION

In the known processes for forming raised contact metallizations, which are also technically described as so-called "bumps", a fundamental differentiation is to be made between mask-oriented processes and processes which are rather to be described as mechanical.

Processes are described as mask-oriented processes where the arrangement and geometric state of the raised contact metallizations are defined by surface masks which only leave free the regions of connection surfaces of a substrate surface which is otherwise covered by the mask. Only then in a second procedural step is the contact material applied to the connection surfaces, which are technically also described as so-called "pads", for example by means of galvanic or chemical separation processes.

In all of the aforementioned, mask oriented processes the selective application of the contact material intended for forming the raised contact metallizations is achieved by masking the substrate surface. To assemble the mask, usually photolithographic processes for structuring a photosensitive lacquer or similar processes are required. In addition, after the formation of the raised contact metallizations the mask must again be removed from the substrate surface. In particular the process expenditure associated with the formation of such a mask is only worthwhile with mass production of substrates with standardized connection-surface distribution.

In contrast, the aforementioned mechanical processes for forming raised contact metallizations have the advantage that a selective formation of raised contact metallizations on the pads is possible without the previous formation of an appropriate surface mask. With such processes the wire connection technology is used which has been developed in itself to make wire connections between connection surfaces of the same substrate or different substrates. In wire connection technology a process technically described as "ball-wedge-process" has become generally accepted, where first of all a ball is formed on a wire end section, drawn from the nose-piece of a bonding capillary, by means of thermal loading of the wire end. This ball is connected to the first connection surface with deformation by means of the nose-piece of the bonding capillary. Subsequently, a wire loop is formed to overcome the distance between the first connection surface and a second connection surface, and finally to make the connection between the wire end section and the second connection surface the wire end section is pressed with deformation against the second connection surface with a connection region of a pressure surface of the capillary nose piece, and with simultaneous separation of the partial wire section is connected to the connection surface. This second making of a connection is technically described as "wedge".

The use of this method known in itself from wire connection technology for the formation of a raised contact metallizations on a substrate connection surface is disclosed in DE- 32 09 242.

In the known process a wire ball formed with thermal loading at the free end of a wire end section drawn from the capillary nose piece is pressed against a substrate connection surface and is connected thereto. The separation of the wire end section drawn from the capillary nose piece to form the raised contact metallizations takes place by forming a weak point at the wire end section drawn from the capillary nose piece and by subsequently pulling at the weak point.

The raised contact metallizations formed with the known process has a substantially circular base because of the basic spherical shape of the wire end section drawn from the capillary nose-piece. This results in a relatively small overlap between the raised contact metallizations and the usually rectangular surface of the connection surface. In addition, the volume of the raised contact metallizations which can be attained with the known process is limited by the size of the contact material ball which was previously formed at the wire end section. The ball size is in turn dependent on the wire diameter, with the result that proceeding from a given wire diameter only raised contact metallizations with a fixed volume can be attained.

The object of the present invention is to suggest a process and a device for forming a raised contact metallization on a substrate connection surface, which make possible an adaptation of the volume of the raised contact metallization to the geometry and size of the connection surface.

The object is achieved with a process having the features of the following described invention.

In the process in accordance with the invention first of all a first connection is made between a free end of the wire end section of a contact material wire and the connection surface in order to form a first connection region, and subsequently a second connection is made between a running end of the wire end section, which is connected to the remaining contact material wire, and the connection surface or a partial region of the wire end section connected to the connection surface in order to form a second connection region, in such a way that between the first and the second connection region a defined length of wire is formed and the connection regions form together with the length of wire a contact material volume, and finally there is a remelting of the contact material volume formed on the connection surface in order to form the raised contact metallization.

Differing from the previously known process disclosed in DE 32 09 242, in addition to the connection regions of the wire end section, the contact material volume available to form the raised contact metallization is defined by the length of wire produced between the connection regions. Because the material volume of the length of wire depends on the length of the length of wire, the volume desired for the formation of the raised contact metallization can be adjusted easily by an appropriate length of the length of wire. This type of volume adjustment is independent of the cross section of the contact metal wire used. It is also possible, by means of an appropriate course of the length of wire, to adapt the latter to a particular extent to the surface geometry of the connection surface.

In this respect, the second connection can be made just as the first connection directly with the connection surface or also with a partial region of the wire end section which is already connected at one end to the connection surface. The second alternative proves advantageous particularly if the connection surface only has a relatively small surface.

In particular for the latter case it also proves advantageous if the second connection of the wire end section with the partial region of the wire end section which is already connected at one end to the connection surface is made in such a way that the partial region corresponds with the first connection region. In this way both connection regions are arranged directly one on top of the other, with the result that an arrangement of the connection regions is created such that a large amount of space is saved and such that the connection regions overlap, whereby—as in the aforementioned cases as well—the material volume required to form the raised contact metallizations is provided substantially by the length of wire formed between the connection regions.

In certain cases, however, it can also prove to be advantageous if the second connection of the wire end section with the partial region of the wire end section which is already connected at one end to the connection surface is made in such a way that the partial region is arranged with clearance from the first connection region. In this respect, the clearance can even be selected such that the second connection region is located outside the connection surface, whereby, nevertheless, a defined length of wire is created. This can be of advantage in particular if very high contact metallizations are to be formed on very small connection surfaces.

In particular with connection regions which lie relatively close to each other or also one on top of the other, a formation of the bonding tool as bonding capillary proves advantageous, the capillary being provided with a capillary nose-piece which has at least one pressure surface for the formation of a connection region at a wire end section drawn from the capillary nose-piece, whereby adjacent to the pressure surface a wire accommodation area is formed which is used for the recessed accommodation of the wire end section in the surface of the capillary nose-piece.

With the wire accommodation area an avoidance area is formed for the length of wire, so that the length of wire can be formed in a substantially undisturbed manner even when the connection regions lie close to each other or one on top of the other.

To be able to form lengths of wire not only in a main orientation it proves advantageous if the capillary nose-piece is provided with another pressure surface, arranged opposite the first one, for the formation of a connection region, and if a wire accommodation area is likewise provided adjacent to this additional pressure surface. In addition, however, the process in accordance with the invention can also be carried out with bonding tools designed as bonding wedges.

In the following the process for forming raised contact metallizations and a suitable device for carrying out the process will be explained by way of example with reference to the drawings.

DETAILED DESCRIPTION OF THE INVENTION

Figure 1:
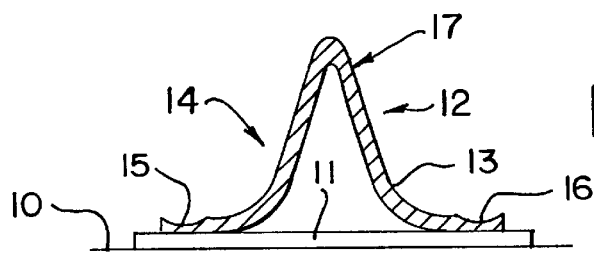
FIG. 1 shows the formation of a length of wire between two connection regions of a contact metal wire for forming a contact material volume for a raised contact metallization.

FIG. 1 shows a connection surface 11 arranged on a substrate 10 and provided, for example, with a gold application, on which connection surface there is arranged a contact material volume 14 formed from a wire end section 12 of a contact material wire 13. The substrate can be a chip or another arbitrary substrate. To carry out the process explained in the following it is only essential to have a connection surface 11 on which the contact material volume 14 can be formed with the use of a wire bonding process known in principle.

The contact material volume 14 consists of two connection regions 15, 16 of the wire end section 12 and a length of wire 17 formed in the shape of a loop between the connection regions 15, 16.

In the exemplary embodiment shown in FIG. 1 the connection surface 11 has a surface of 250×60 µm, whereby the longitudinal side is shown in FIG. 1. The contact material wire 13 consists here of a lead/tin solder alloy with a high lead content, for example PbSn2, whereby the wire end section 12 has a diameter of 40 µm.

From FIG. 1 it becomes clear that the contact material volume 14 is substantially determined by the length of the length of wire 17 formed between the connection regions 15 and 16.

Figure 2:
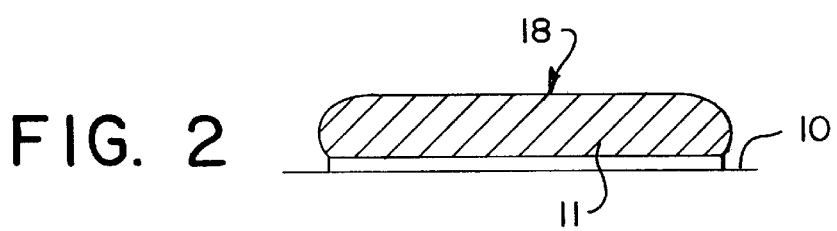
FIG. 2 shows a raised contact metallization formed by remelting the contact material volume shown in FIG. 1.

FIG. 2 shows a raised contact metallization 18 produced from the contact material volume 14 (FIG. 1) by remelting. With the contact material wire 13 used here a temperature of about 310° C. is required for the remelting process. Because of the adhesion of the molten contact material to the wettable connection surface 11 and because of the surface tension of the molten contact material volume 14, the contact metallizations 18 is formed with a relatively greatly pronounced meniscus. The contact metallization 18 shown in FIG. 2 is suitable, for example, for flip-chip contacting of the substrate which is provided with it.

Figure 3:
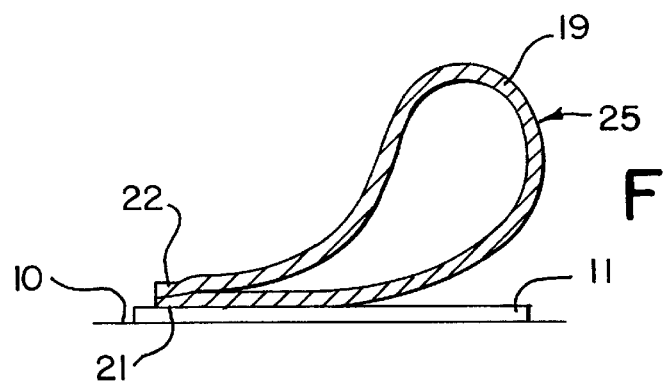
FIG. 3 shows another example for forming a contact material volume on a connection surface.
Figure 4:
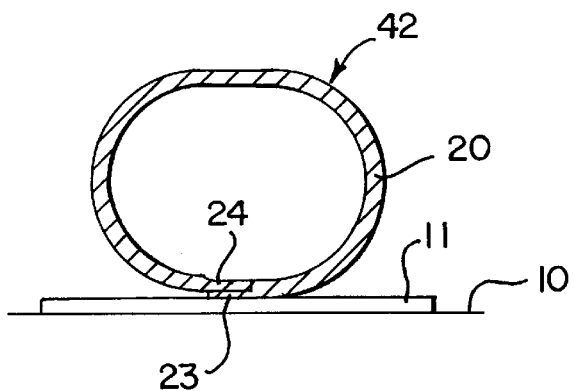
FIG. 4 shows another example for forming a contact material volume on a connection surface.

In FIGS. 3 and 4 further examples for the formation of lengths of wire 19 and 20 between connection regions 21, 22 and 23, 24 on the connection surface 11 are shown.

Figure 5:
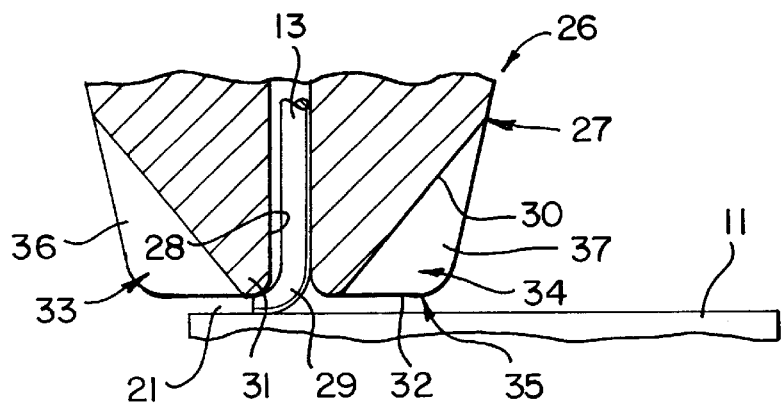
FIGS. 5, 6 and 7 show the formation of the contact material volume, shown in FIG. 3, in three successive phases, while showing a device which can be used in this respect.
Figure 6:
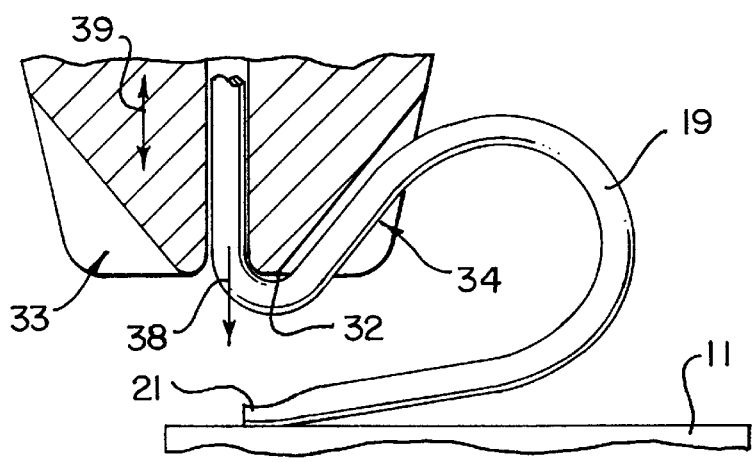
Figure 7:
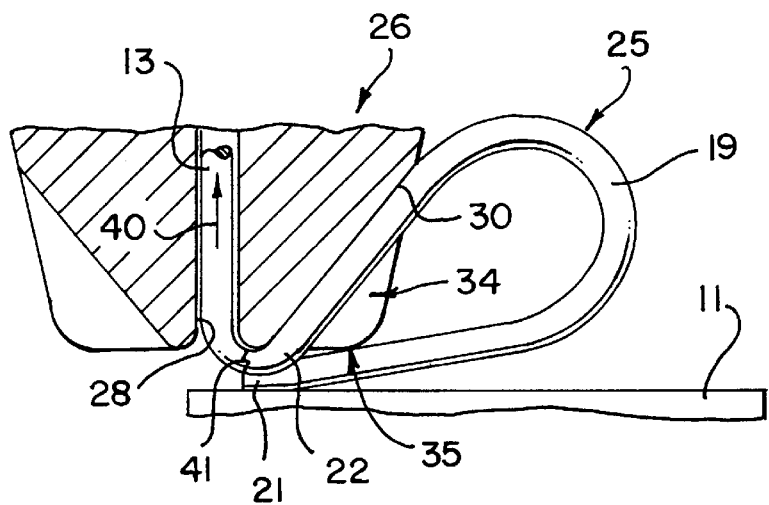

FIGS. 5 to 7 show in chronological sequence the formation of the length of wire 19, the formation of which is complete between the connection regions 21 and 22 and which is shown in FIG. 3. To form the length of wire 19 or, a contact material volume 25 formed from the length of wire 19 and the connection regions 21, 22, a bonding tool constructed as bonding capillary 26 is activated in the so called "wedge-wedge-mode" and in this respect carries out the temporally successive movements indicated in FIGS. 5 to 6.

The bonding capillary 26 shown in FIG. 5 in a longitudinal section in the region of a capillary nose-piece 27 has a wire guide channel 28 extending in this exemplary embodiment coaxially to the longitudinal axis of the bonding capillary 26. A wire end section 29 of the contact material wire 13 which can be moved out of the wire guide channel 28 by means of a feed device which is not shown in more detail is drawn from the wire guide channel 28. At the opening of the wire guide channel 28 two pressure surfaces 31, 32 arranged opposite each other are provided, each of which passes over into a wire accommodation area 33, 34 formed here in the shape of a V-slot in cross section. In the longitudinal-section view shown in FIG. 5 in each case one can only see the guide bevel 36 and 37 extending perpendicular to the drawing plane from a slot base 30 inclined downwards to a contact surface 35 of the capillary nose piece 27.

For the formation of the first connection region 21 shown in FIG. 5 the wire end section 29 projecting from the capillary nose-piece 27 is moved by means of the bonding capillary 26 towards the connection surface 11 in such a way that in the configuration shown in FIG. 5 by means of pressure of the pressure surface 31 the wire end section 29 is deformed with the formation of the connection region 21 and is connected to the connection surface 11. In this respect, a temperature and/or ultrasound loading is superimposed on the pressure in such a way as is known from wire bonding techniques currently practised. In technical terms the first connection region 21 is also described as the first wedge.

FIG. 6 shows a phase of the travel of the bonding capillary 26, where, superimposed by a feed movement 38 of the contact material wire, it is moved upwards and subsequently downwards again in the direction of the connection surface 11 (double arrow 39). In this respect, the loop shaped length of wire 19 shown in FIG. 6 is formed.

In FIG. 6 it can be clearly recognized how the contact material wire 13, with formation of the length of wire 19, is partially placed into the wire accommodation area 34, whereby the substantially undisturbed loop shaped formation of the length of wire 19 becomes possible. In addition, by means of the wire accommodation area 34 the formation of the pressure surface 32 which is relatively small compared with the contact surface 35 of the capillary nose-piece 27 becomes possible in order to attain high pressure and deformation forces with relatively little contact pressure of the bonding capillary 26.

FIG. 7 shows the formation of the second connection region 22 or second wedge, where the contact material wire 13, with deformation by means of the pressure surface 32, is connected to the first connection region 21 or wedge. When the connection is being made or immediately after it has been made, the contact material wire 30 is pulled (arrow 40) so that the contact material wire 13 is broken at a separating point 41 indicated by a zigzag line and in this way the contact material volume 25 already shown in FIG. 3 is formed.

Figure 8:
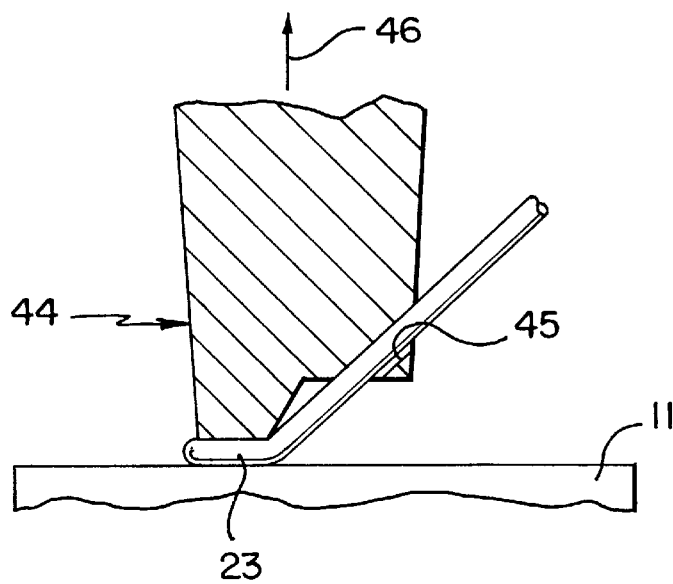
FIGS. 8 and 9 show the formation of the contact material volume, shown in FIG. 4, in two successive phases, while showing a device which can be used in this respect.
Figure 9:
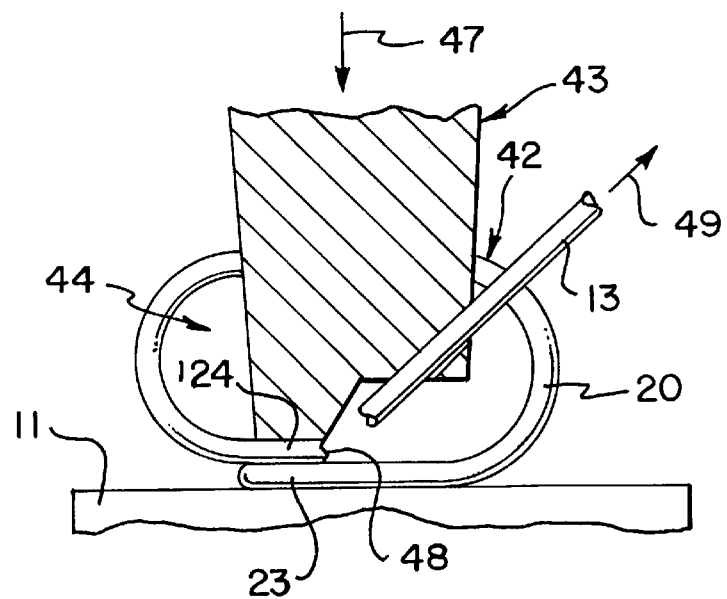

FIGS. 8 and 9 show in two successive production phases the formation of the length of wire 20, the formation of which is complete between the connection regions 23 and 24 and which is shown in FIG. 4. A bonding tool constructed here as bonding wedge 43 is used to form the length of wire 20 on a contact material volume 42 formed from the length of wire 20 and the connection regions 23, 24. The bonding wedge 43 differs from the bonding capillary shown in FIGS. 5 to 7 substantially by a wire supply channel 45 arranged such that it extends inclined to a wedge extension 44. In this respect, the bonding wedge 43 corresponds to the bonding tools which are conventionally used in so-called "ultrasound bonding".

FIG. 8 shows the formation of the first connection region 23, where the relevant wire end is connected to the connection surface 11. After the formation of the first connection region 23 the bonding wedge 43 is moved upwards (arrow 46) until the length of wire 20 required to form the contact material volume 42 is produced. Subsequently, to form the second connection region 24 the bonding wedge 43 is again moved downwards (arrow 47) towards the connection surface 11 in such a way that the connection region 24 is formed on the connection region 23, as shown in FIG. 9. The length of wire 20 formed in this respect in the shape of a loop is applied to the side of the top region and the wedge extension 44 of the bonding wedge 43 and is deflected slightly in a direction at right angles to the drawing plane so that, even with the use of the conventional bonding wedge 43 shown, the formation of the contact material volume 42 with the loop-shaped length of wire 20 is possible in a relatively unhindered manner.

After the second connection region 24 has been completed a separation of the running end of the contact material wire 13 by means of a tensile force 49 acting in the longitudinal direction of the contact material wire 13 also takes place here, as clarified by a point of separation 48.

It is pointed out that both the formation of the contact material volume 25 shown in FIG. 3 and the formation of the contact material volume 42 shown in FIG. 4 are possible with both bonding tools shown in FIGS. 5 to 7 or 8 and 9.

We claim:

1. A process for forming a raised contact metallization on a connecting surface of a substrate with the use of a wire bonding device having a bonding tool, whereby by means of the bonding tool to form a first connection region first of all a first connection is made between a free end of a wire end section of a contact material wire drawn from a nose piece and the connection surface, and subsequently to form a second connection region, a second connection is made between a running end of the wire end section connected to the remaining contact material and the connection surface and a partial region of the wire end section already connected at one end to the connection surface, and finally a separation of the wire end section connected to the connection surface from the remaining contact material wire taken place, wherein between the first connection region and the second connection region a defined length of wire is formed, and the connection regions form together with the length of wire a contact material volume which is remelted in order to form the raised contact metallization.

2. Process according to claim 1, characterized in that the second connection of the wire end section (29) with the partial region of the wire end section (29) which is already connected at one end to the connection surface (11) is made in such a way that the partial region corresponds with the first connection region (21).

3. Process according to claim 1, characterized in that the second connection of the wire end section (29) with the partial region of the wire end section (29) which is already connected at one end to the connection surface (11) is made in such a way that the partial region is arranged with clearance from the first connection region (21).

4. A bonding tool for forming a raised contact metallization according to claim 1, having a capillary nose-piece which, adjacent to a wire guide channel, has at least one pressure surface for forming a connection region at a wire end section drawn from the wire guide channel, and a wire accommodation area arranged adjacent to the pressure surface, wherein the wire accommodation is arranged separated from the opening of the wire guide channel by the pressure surface and is used for the recessed accommodation of a partial section of the wire end section guided around the pressure surface in a contact surface of the capillary nose-piece.

5. Bonding tool according to claim 4, characterized in that opposite the first pressure surface (32) a second pressure surface (31) is arranged which, correspondingly adjacent to the first pressure surface (32), passes over into a wire accommodation area.

* * * * *